(12) United States Patent
Ganille et al.

(10) Patent No.: US 11,651,302 B2
(45) Date of Patent: May 16, 2023

(54) METHOD AND DEVICE FOR GENERATING SYNTHETIC TRAINING DATA FOR AN ARTIFICIAL-INTELLIGENCE MACHINE FOR ASSISTING WITH LANDING AN AIRCRAFT

(71) Applicant: THALES, Courbevoie (FR)

(72) Inventors: Thierry Ganille, Mérignac (FR); Guillaume Pabia, Mérignac (FR)

(73) Assignee: THALES, Courbevoie (FR)

( * ) Notice: Subject to any disclaimer, the term of this patent is extended or adjusted under 35 U.S.C. 154(b) by 472 days.

(21) Appl. No.: 17/027,629

(22) Filed: Sep. 21, 2020

(65) Prior Publication Data
US 2021/0141986 A1 May 13, 2021

(30) Foreign Application Priority Data
Nov. 7, 2019 (FR) ...................................... 1912488

(51) Int. Cl.
| | |
|---|---|
| G06N 20/00 | (2019.01) |
| G06Q 10/04 | (2023.01) |
| G06F 30/27 | (2020.01) |
| G05D 1/00 | (2006.01) |
| G05D 1/10 | (2006.01) |
| G06N 3/04 | (2023.01) |
| G06F 18/214 | (2023.01) |
| G06F 18/21 | (2023.01) |

(52) U.S. Cl.
CPC .......... *G06Q 10/04* (2013.01); *G05D 1/0088* (2013.01); *G05D 1/101* (2013.01); *G06F 18/214* (2023.01); *G06F 18/217* (2023.01); *G06F 30/27* (2020.01); *G06N 3/04* (2013.01); *G06N 20/00* (2019.01)

(58) Field of Classification Search
CPC .......... G06Q 10/04; G06N 20/00; G06N 3/04; G06F 30/27; G06F 18/217; G06F 18/214; G05D 1/0088; G05D 1/101
See application file for complete search history.

(56) References Cited

PUBLICATIONS

Zhu, et al., "Unpaired Image-to-Image Translation using Cycle-Consistent Adversarial Networks", Proceedings of the IEEE International Conference on Computer Vision (ICCV), 2017.
Isola, et al. "Image-to-image translation with conditional adversarial networks", CVPR, 2017.
Park et al., "Semantic Image Synthesis with Spatially-adaptive Normalization", CVPR, 2019.

*Primary Examiner* — Mathew Franklin Gordon
(74) *Attorney, Agent, or Firm* — BakerHostetler

(57) ABSTRACT

A computer-implemented method for generating synthetic training data for an artificial-intelligence machine, the method includes at least steps of: defining parameters for at least one approach scenario of an aircraft approaching a runway; using the parameters of the at least one scenario in a flight simulator to generate simulated flight data, the flight simulator being configured to simulate the aircraft in the phase of approach toward the runway and to simulate an associated automatic pilot; using the simulated flight data to generate a plurality of ground-truth images, the ground-truth images corresponding to various visibility conditions; and generating, from each ground-truth image, a plurality of simulated sensor images.

12 Claims, 8 Drawing Sheets

Figure 3
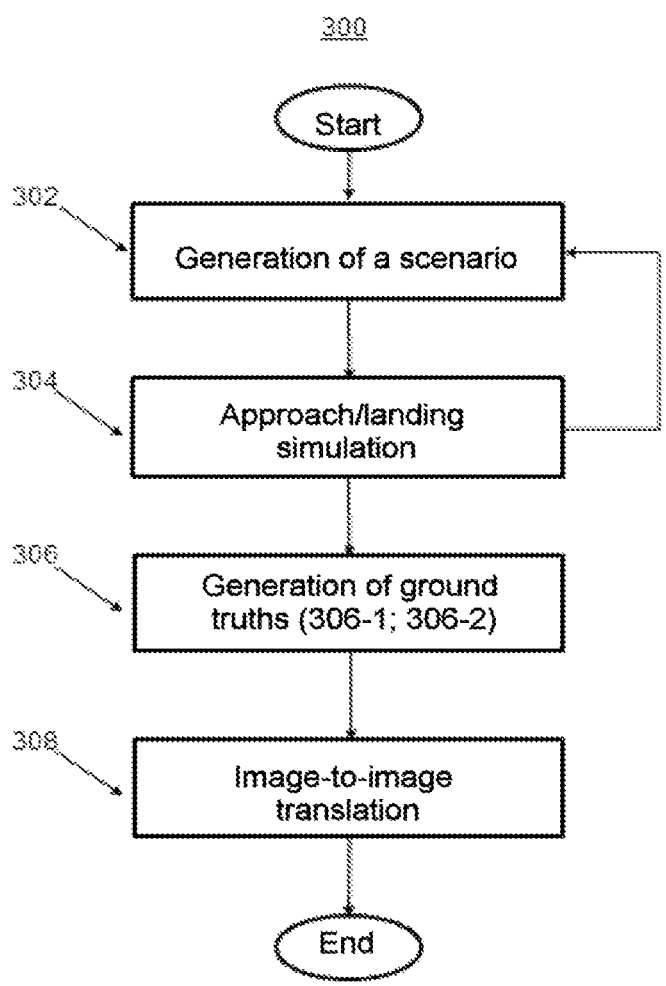
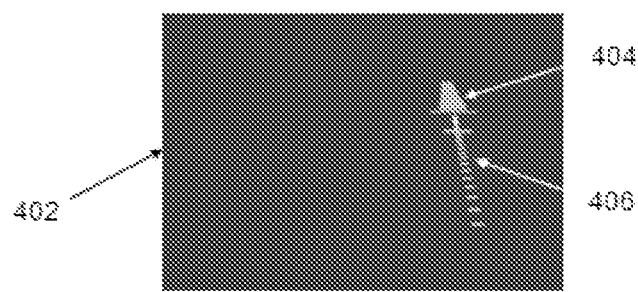
Figure 4a

METHOD AND DEVICE FOR GENERATING SYNTHETIC TRAINING DATA FOR AN ARTIFICIAL-INTELLIGENCE MACHINE FOR ASSISTING WITH LANDING AN AIRCRAFT

CROSS-REFERENCE TO RELATED APPLICATIONS

This application claims priority to foreign French patent application No. FR 1912488, filed on Nov. 7, 2019, the disclosure of which is incorporated by reference in its entirety.

FIELD OF THE INVENTION

The invention relates to the general field of aircraft systems for assisting with landing, and in particular it provides a method and a device for generating synthetic training data that may be used by a deep-learning artificial-intelligence (AI) machine to recognize a runway.

BACKGROUND

In particular, the invention addresses the problem of recognition of a runway under difficult meteorological conditions, such as foggy conditions for example, leading to decreased or degraded visibility.

Flight standards set rules with respect to the visibility that must be obtained during the landing phase. These rules are expressed in terms of decision thresholds that refer to the altitude of the aircraft during its descent phase. At each of these thresholds, identified visual references must be obtained for the landing manoeuvre to continue (the approach must be missed if they are not). Missed approaches represent a real problem to the management of air traffic and to flight planning. It is necessary to estimate, before take-off, how easy it will be to land at the destination on the basis of weather forecasts of greater or lesser reliability, and where appropriate to provide fall-back solutions.

The problem of landing aircraft under low-visibility conditions, in addition to visual identification by the pilot in sensor data, has been the reason for the development of a number of approaches, such as ILS (instrument landing systems), SVS (synthetic vision systems), EVS or EFVS (enhanced (flight) vision systems) and also CVS (combined vision systems).

EVS, EFVS and CVS are based on the presentation of a sensor image to the pilot and the identification by said pilot of the runway and are based on forward-looking sensors of the aircraft that provide an enhanced detection capacity with respect to the eyes of the pilot, in particular under conditions of degraded visibility. However, this type of sensor does not allow a runway to be systematically detected before the regulatory minima, typically before the aircraft is under a height of 200 ft above the runway threshold elevation for an ILS approach of category I.

So-called passive sensors, such as IR sensors in the infrared domain, are based on the parasitic infrared radiation of lights present in the vicinity of the runway. For the sake of light durability and therefore of cost, the current tendency is to replace incandescent lights with LED lights. The latter have a spectrum that spreads less into the infrared domain. A collateral effect is therefore that EVS based on infrared sensors are becoming technologically obsolete.

An alternative to infrared sensors is to obtain images using a so-called active sensor such as a radar sensor, in the centimetre or millimetre band. Certain frequency bands chosen to lie outside the absorption peaks of water vapour have a very low sensitivity to difficult meteorological conditions. Such sensors therefore allow an image to be produced through fog for example. However, even though these sensors have a fine distance resolution, they have an angular resolution that is far courser than optical solutions. The resolution is directly related to the size of the antennas used, and it is often too course to obtain an image that is interpretable easily enough by the pilot to be used for guidance.

The emergence of the use of active sensors such as, for example, LIDARs (light detection and ranging) or millimetre radars, which are capable of detecting a runway from further away and under almost any visibility conditions, has led to much better results than those obtained with passive sensors such as IR cameras. However, the data generated by such active sensors do not allow a clear and easily interpretable image (i.e. an image like an IR image) to be generated. There is thus a problem with identification of the runway by the pilot in sensor data in particular generated by forward-looking active sensors of the aircraft.

Image-processing solutions dedicate the runway-identification task to an algorithm rather than to the pilot.

Current image-processing solutions use conventional algorithms (detection of straight lines, corners, etc.) to identify the runway. However, recognition of a runway in a sensor image when visibility is poor may lack reliability when conventional algorithms are used. Specifically, each type of degraded weather is particular and certain conditions may make the runway-detecting algorithms ineffective. The performance of display or control computers using images for flight operations is decreased as a result.

Recent approaches to improving image-processing algorithms for flight operations related to landing under poor meteorological conditions leading to decreased or degraded visibility employ algorithms based on artificial neural networks.

An artificial neural network is a system whose design was, at the very beginning, schematically inspired by the operation of biological neurons, and that hence is comparable to statistical methods. Neural networks are generally optimized using machine-learning methods.

Thus, a large majority of artificial neural networks possess a learning or training algorithm that modifies synaptic weights in light of a dataset fed to the network as input. The aim of this training is to allow the neural network to learn from examples and to produce trained artificial-intelligence models.

Deep learning forms part of the family of machine-learning methods. Deep machine learning must be carried out on sufficiently large databases, capable of training systems of large sizes. New data may be continuously added to the training database to refine the training. The advantage of deep-learning algorithms over conventional algorithms is their ability to constantly be improved by increasing the size of their training database. The method conventionally used to generate training databases for algorithms based on deep-learning artificial intelligence consists in using real data, which are labelled manually or with tools of limited automation, in order to generate a ground truth (GT).

One of the keys to successful deep learning is the construction of a large training database. However, in the context of the invention, in which the training data come from real sensor images, the crux of the problem is the variability in conditions, and resides in the difficulty in obtain a high number of sensor images for various approaches towards various runways, with different approach light systems (ALS), under various meteorological conditions and for various aircrafts.

Moreover, another brake on the enrichment of training databases in the context of the invention is the cost of flights to collect images, meaning that the number of flights remains very limited.

Therefore, the image bank that contains all of the collected sensor images currently remains of too small a size.

However, the volume of such an image bank must reach a threshold that is high enough for the content (the training data) to be reliable in terms of precision and in terms of geographical coverage.

SUMMARY OF THE INVENTION

One objective of the invention is therefore to meet the aforementioned needs and to mitigate the drawbacks of known techniques.

Thus, the invention provides a way of generating labelled synthetic training data that may be used by a deep-learning algorithm in order to generate trained artificial-intelligence models that are integrated into systems for assisting with landing aircraft.

To this end, one subject of the invention is a way of automatically generating training data with the aim of training an artificial intelligence to recognize an runway for an aircraft under degraded visibility conditions.

Thus, advantageously, images obtained by a generator of synthetic images according to the method of the invention may be used alone or added to a bank of real images as additional training data.

The general principle of the invention is based on the use of a flight simulator and an automatic generator of realistic ground-truth images that is combined with the implementation, on a conditional generative adversarial neural network (cGAN), of an image-translating method for generating a high number of simulated sensor images from each ground-truth image.

Advantageously, the method of the invention allows a training database, the volume of which is much greater than when real data are used, and that simulates a greater number of different conditions than is possible with real data, to be obtained. This allows the detection capacity of runway-recognition systems using trained models obtained from synthetic training data generated according to the invention to be considerably increased.

Advantageously, the database constructed with synthetic data may be used to validate the robustness or weakness of various runway-detection algorithms with respect to various use cases considered as problematic, as it allows various algorithms to work in parallel on the synthetic dataset and, in the results delivered, excessively large differences between the various algorithms to be detected.

The present invention is applicable to many fields and especially to the detection of runways, runway outlines, banks of lights, and approach light systems.

To obtain the sought results, a computer-implemented method for generating synthetic training data for an artificial-intelligence machine is provided. The method comprises at least the steps of:
defining parameters for at least one approach scenario of an aircraft approaching a runway;
using the parameters of said at least one scenario in a flight simulator to generate simulated flight data, said flight simulator being configured to simulate said aircraft in the phase of approach toward said runway and to simulate an associated automatic pilot;
using the simulated flight data to generate a plurality of ground-truth images, said ground-truth images corresponding to various visibility conditions; and
generating, from each ground-truth image, a plurality of simulated sensor images, said simulated sensor images being able to be used as training data to train an artificial-intelligence machine for assisting with aircraft landing.

According to alternative or combined embodiments:
the step of generating simulated sensor images consists in implementing, on a conditional generative adversarial neural network, an image-to-image translation algorithm, said image-to-image translation algorithm allowing a ground-truth image to be translated into a simulated sensor image.
the step of generating simulated sensor images consists in generating simulated infrared images.
the step of generating a plurality of ground-truth images comprises the steps of:
generating a first-level ground-truth image in which only a restricted number of elements of interest feature in the image, each element of interest respectively being represented by one type of uniform information, said elements of interest comprising at least the runway represented by a first type of uniform information and the approach light system represented by a second type of uniform information; and
generating, from the first-level ground-truth image, various masked ground-truth images corresponding to different visibility conditions.
each masked ground-truth image contains at least four classes or colours, each class respectively being associated with one label.
the four classes are the runway, the approach light system, visible data and invisible data.
the step of generating simulated sensor images consists in translating a label in a ground-truth image into a texture for a simulated sensor image.
the step of defining at least one approach scenario consists in defining parameters relative to at least one given runway, and to meteorological conditions and environmental conditions.
the step of generating simulated flight data consists in simulating various approach paths of the simulated aircraft and of the automatic pilot with the scenario parameters, and in generating simulated flight data for the various paths comprising the position (latitude, longitude, altitude) and the attitude (yaw, pitch, roll) of the simulated aircraft.
the method in addition comprises a step consisting in storing the plurality of simulated sensor images in a database of synthetic training data.

The invention also covers a computer-program product containing code instructions allowing the steps of the claimed method to be performed when the program is executed on a computer.

The invention in addition covers a device for generating synthetic training data for an artificial-intelligence machine, the device comprising means for implementing the steps of the method claimed according to any one of the claims.

BRIEF DESCRIPTION OF THE DRAWINGS

Other features, details and advantages of the invention will become apparent on reading the description, which is given with reference to the appended drawings, which are given by way of example and respectively show:

FIG. 3 a method for generating synthetic data according to one embodiment of the invention;

FIG. 4a an example of a first-level ground-truth image obtained according to one embodiment of the method of the invention;

DETAILED DESCRIPTION

Figure 1:
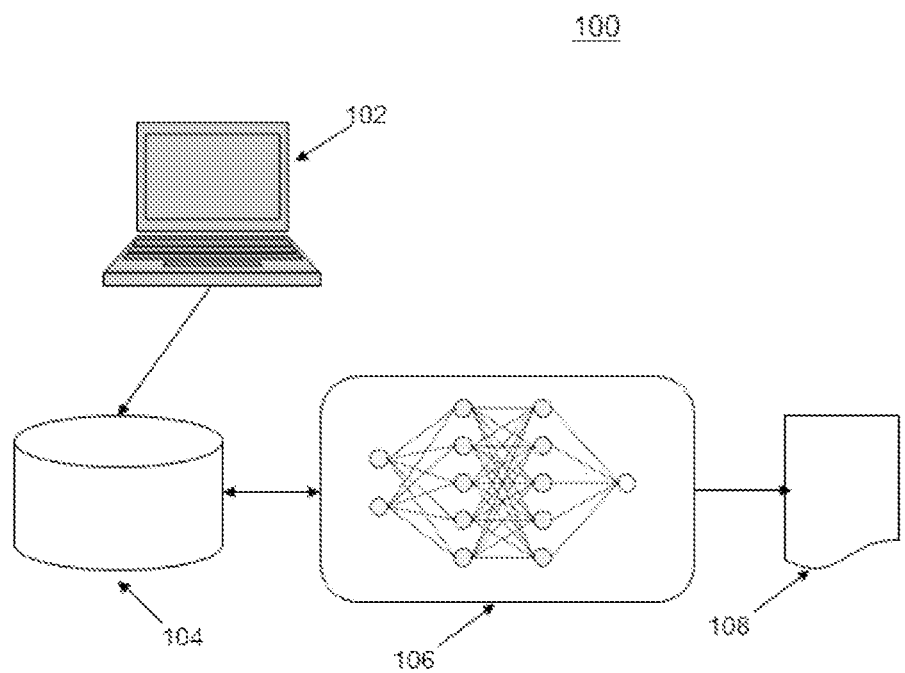
FIG. 1 a general architecture of a system for generating artificial-intelligence models that has been trained to recognise runways and ALS using a database of synthetic training data constructed according to one embodiment of the invention.

FIG. 1 illustrates a general architecture of a system 100 for generating artificial-intelligence models that has been trained to recognize runways using a database of synthetic training data constructed according to one embodiment of the invention.

The system 100 generally comprises a training database 104 coupled to an image-analysing module 106 configured to implement a deep-learning artificial-intelligence algorithm and to generate trained artificial-intelligence models (AI models) 108.

The training database 104 must contain a very high number of data representing a maximum of possible situations, encompassing various approaches toward various runways with various approach light systems (ALS) under various meteorological conditions. In order to implement a deep-learning method and to learn to recognize the runway in the data, the training database contains synthetic training data generated according to the principles of the invention.

The synthetic training data of the training database 104 are delivered by a device 102 able to generate synthetic data according to the method of the invention.

In one embodiment (not illustrated) real training data may be added to the training database 104 in order to increase the training dataset. The real training data are generated by sensors with which aircraft are equipped, irrespectively of whether it is a question of images in the visible or infrared or radar data.

The real images may be delivered by a multitude of different sensors with which multiple aircraft performing either real flights or flights dedicated to capturing images are equipped, each image being associated with corresponding flight parameters, and especially parameters relating to the 3D position and 3D orientation of the aircraft at the time of the image capture.

Returning to FIG. 1, the image-analysing module 106 is configured to apply a deep-learning algorithm to synthetic training datasets obtained from the training database 104, and to generate trained artificial-intelligence models (AI models) 108 that may be placed on-board aircraft for use in operational flights.

In one embodiment, the image-analysing module of the invention 106 employs a deep-learning algorithm to detect runways and ALS. In one advantageous embodiment, the algorithm is based on a convolutional neural network (CNN).

In the field of machine vision, the objective of deep learning is to model data with a high level of abstraction. Summarily, there are two phases: a training phase and an inference phase. The training phase allows a trained AI model that meets the operational requirement to be defined. This model is then used in the operational context in the inference phase. The training phase is therefore essential. In order to obtain the best model, the training phase therefore requires a large training database to have been constructed that is as representative of the operational context as possible. The invention meets this need to construct a training database.

Correct training defines a predictive model that fits the training data well but that is also capable of making correct predictions on the basis of data not seen during training. If the model does not fit the training data, the model has been under-trained. If the model fits the training data too well and is not capable of generalizing, the model has been over-trained. Thus, on the basis of many data of the training database 104, the training phase allows the best hyper-parameters of the architecture, i.e. those that best model the various labels (runway/ALS), to be sought. In each iteration, the neural network 106 propagates (i.e. extraction/abstraction of the features specific to the objects of interest) and evaluates the presence and position of the objects. On the basis of this evaluation and of the ground truth (i.e. the image of the ground truth), the training algorithm computes a prediction error and back-propagates the error into the network with a view to updating the hyper-parameters of the model. A training phase thus comprises many iterations on the various training data in order to converge to a low error and a high AI-model precision.

Figure 2:
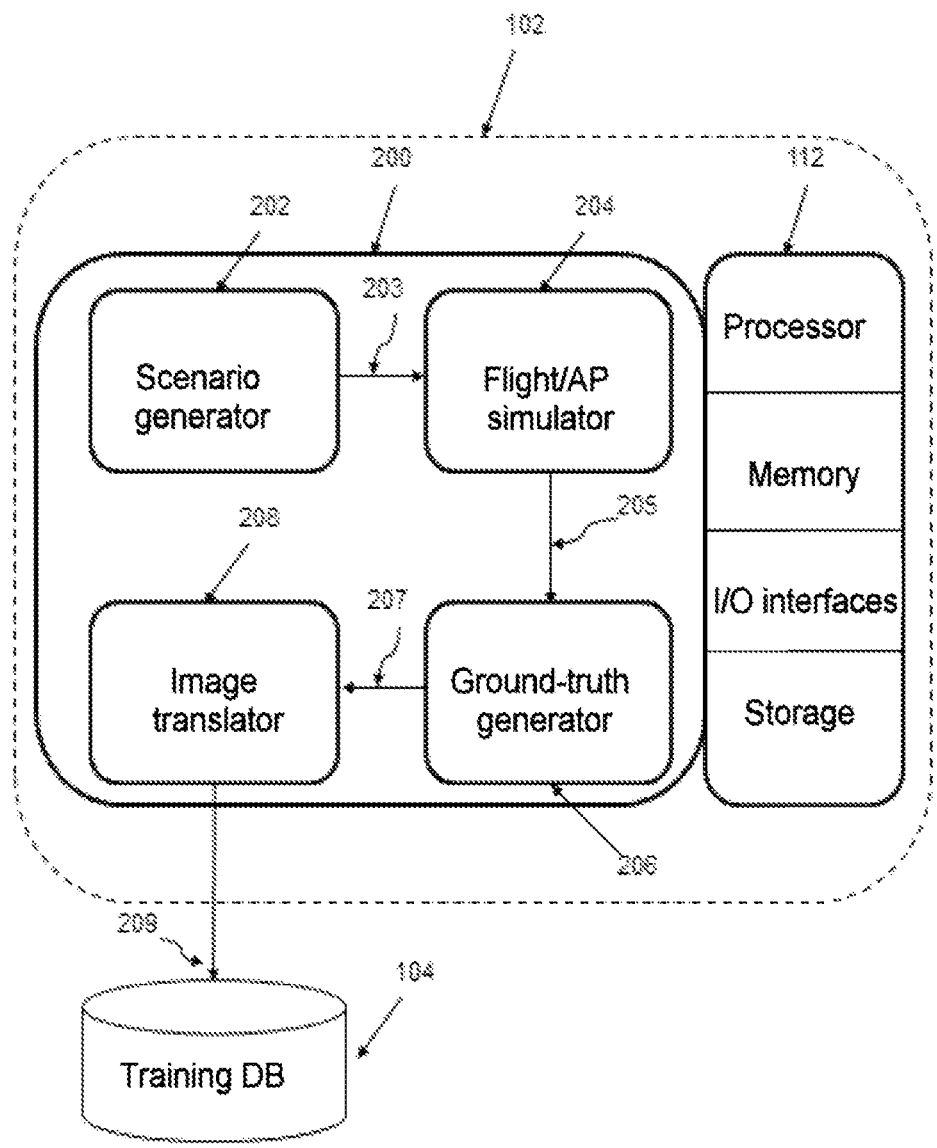
FIG. 2 a schematic of a device for generating synthetic data according to one embodiment of the invention.

FIG. 2 shows a schematic of a device 200 for generating synthetic training data according to one embodiment of the invention, which comprises a plurality of modules including a scenario generator 202, a flight simulator and its automatic pilot 204, a ground-truth generator 206, and an image-to-image translator 208.

In one embodiment, the device 200 for generating synthetic training data is implemented in a computer 102 that comprises, as known 112: at least one processor; a memory configured to store the code instructions of various programs, these instructions including code instructions allowing the logic functions of the various modules of the device 200, which are executable by the processor according to a system of exploitation, to be executed; a storage module; I/O interfaces for input/output to peripherals and interconnect buses.

The device of the invention 200 may thus be implemented using hardware and/or software elements. It may be made available on a computer-readable medium in the form of a processor-executable computer-program product that contains instructions for executing the steps of the methods in their various embodiments.

The device 200 of the invention is configured to generate, on the basis of various scenarios produced by the scenario generator 202, simulated sensor images 209 that may be added as training data to a training database 104.

The flight simulator 204 is configured to simulate a type of aircraft with an associated automatic pilot (AP), the simulator and AP together forming a software Flight/AP module configured to simulate realistic paths of approach toward various runways under various meteorological conditions. The dimensioning meteorological factors are the visibility conditions, on which the graphic rendering of the ALS and of the runway will depend, and the wind and turbulence, which will influence the orientation and stability of the simulated sensor with respect to the runway.

Advantageously, the Flight/AP module 204 may be configured to successively carry out a set number of approaches while varying various parameters, such as, for example, the runway on which the aircraft will land, the direction and force of the wind, and the level of turbulence.

To this end, the scenario-generating module 202 allows the Flight/AP simulator module 204 to be automatically initialized at the start of the approach with initialization parameters 203 for a given runway, given weather and initial aircraft parameters. The flight-simulating module associated with the automatic pilot carries out the complete approach until landing with the initial parameters, then the scenario-generating module resets the flight-simulating module with new conditions 203. Thus, advantageously, the Flight/AP simulator 204 may be configured to automatically carry out a very high number of approaches with multiple initial conditions.

In one embodiment, the scenario generator 202 is configured to parameterize environmental conditions such as, for example, the time and the date (which allow the sun to be positioned or night-time conditions to be simulated) and visibility, fogginess, raininess, etc.

The flight simulator 204 generates simulated flight data 205 for a simulated type of aircraft. The flight data, which are the position (latitude, longitude, altitude) and attitude (yaw, pitch, roll) of the aircraft, become the input parameters of the ground-truth generator 206.

The ground-truth generator 208 is configured to automatically generate, from the flight data 205, ground-truth images 207 corresponding to various visibility conditions. The ground-truth images become the inputs of the image translator 208.

The image translator 208 is configured to perform an image-translation function in order, for each ground truth, to obtain various simulated sensor images 209.

Image-to-image translation is a sub-field of machine vision. It is a graphic problem where the objective is to determine the correspondence between a start image and an end image. Known techniques are based on cGANs, pixel-to-pixel translation or cVAEs (condition variational auto-encoders), such as for example in: The pix2pix publication by P. Isola et al. "Image-to-image translation with conditional adversarial networks" in CVPR, 2017, in which cGANs are used to achieve the image-to-image translation, with for example the "translation" of a black-and-white image into colour or indeed even the "translation" of an image captured during the day into an image captured at night. A major restriction on this implementation is that it requires as training data pairs (x,y) that correspond to an image and to its translation.

The CycleGAN publication by J.-Y. Zhu et al., "Unpaired image-to-image translation using cycle-consistent adversarial networks" in Proceedings of the IEEE International Conference on Computer Vision (ICCV), 2017, which further describes changes of season or transfiguration of objects ("translation" of an image of a horse into one of a zebra). This implementation improves the preceding model in that it requires only two datasets and not a one-to-one correspondence between each image (for example a set of images of horses and a set of images of zebras may be provided).

In the context of systems for assisting with landing based on infrared images, the start image is a ground-truth image and the end image is an infrared image. The image-to-image translation in particular makes it possible to make inter-image style transfers or changes to season.

FIG. 3 illustrates the steps of a method 300 for generating synthetic data according to one embodiment of the invention, able to be carried out with the device of FIG. 2.

In a first step 302, the method allows the flight model and the automatic pilot 204 to be automatically initialized at the start of the approach with initial parameters defining a runway, weather and the initial parameters of the aircraft in question. Specifically, the invention is based on the use of a flight model representative of a certain type of aircraft associated with automatic-pilot software, to simulate realistic paths of approach toward various runways under various meteorological conditions.

In a following step 304, the method allows the complete approach up to landing to be simulated with the flight model associated with the automatic pilot 204; then, the method is able to restart so as to generate a new scenario and reset the flight model with new initial conditions. The method may reiterate a very high number of times the simulation of approaches and landings for multiple initial conditions.

To introduce a certain variability in the position of the runway threshold in the flight model, the method allows parameters to be defined as to the position of the runway threshold, in order to simulate approaches that are slightly offset laterally and/or longitudinally from the runway, such as could occur under manual control or with a slightly biased or offset ILS beam or with an LPV approach with a small error in GPS location. The position of the runway threshold is parameterized in the Flight/AP simulator module 204 via the scenario-generating module 202, the automatic pilot thus guiding the aircraft toward the offset runway delivering a view of the runway from a slightly different angle to the sensor data.

In a following step 306, the method allows ground truths to be generated from data output from the Flight/AP simulator 204.

In one embodiment of the step 306, the method first allows solely spatial theoretical data such as should be output from a sensor when visibility is good to be generated for the runway and the ALS in question.

Now, under degraded visibility conditions, it is generally the ALS which is detectable before the runway and therefore, in order to obtain a detection at the earliest possible opportunity, it is important to train the AI to recognize the various types of ALS, which are standardized. However, this is not always the case and sometimes the runway may be the first detectable element. For example, if the ALS employs LEDs rather than incandescent lights, an IR sensor may detect the runway before the ALS. This is also the case for a radar which from far may detect the contrast between the ground and the tarmac of the runway far before the contrast between the ground and the metal of the ALS, the area of the reflecting surfaces of which is much too small. It is therefore important to train the AI to also recognize the runway. The ground-truth generator must therefore be able to identify the runway, i.e. know the position of the two runway thresholds, the type of ALS recognition of which it is desired to teach and the characteristics of the sensor that it is desired to simulate, i.e. the orientation of the sensor in the frame of reference of the aircraft, the horizontal and vertical fields of the sensor and the type of data output, for example, for an image, the horizontal and vertical resolutions in pixels, any deformations, etc.

Figure 4B:
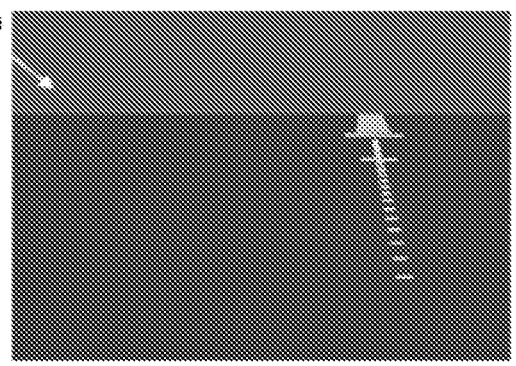
FIG. 4b-FIG. 4e various masked ground-truth images obtained from the ground-truth image of FIG. 4a according to one embodiment of the method of the invention.
Figure 4C:
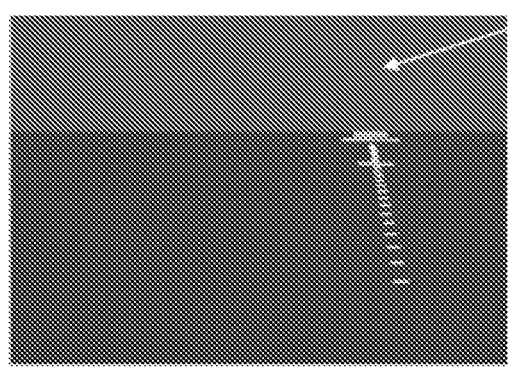
Figure 4D:
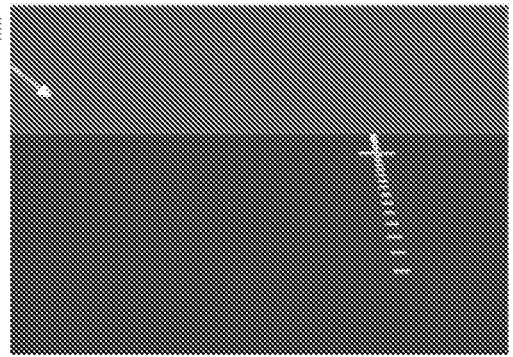
Figure 4E:
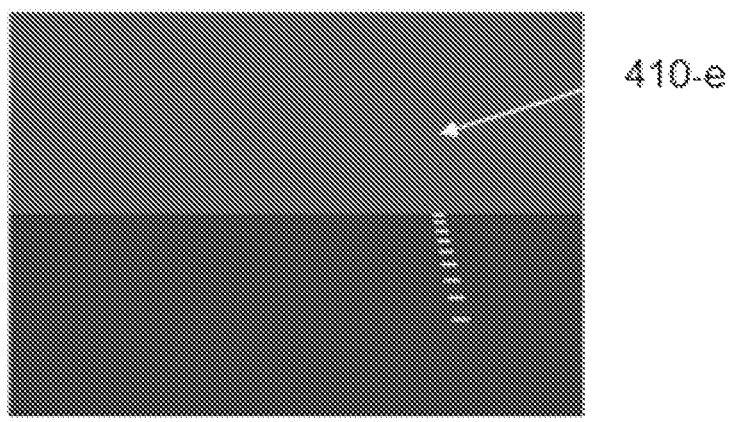

On the basis of these data, the method allows a first-level ground-truth image (306-1) to be generated in which only a restricted number of elements of interest feature. The elements or categories of interest comprise at least the runway and the ALS, all of the other elements forming a single other category. Each category of interest is respectively represented by one type of uniform information, such that the runway is represented by a first type of uniform information, the ALS by a second type of uniform information and the remainder of the other elements by a third type of uniform information. FIG. 4a illustrates a first-level ground-truth image with the minimal categories—runway, ALS, other elements—for a 2D image. The ground truth may for example take the form of an image of uniform colour 402 (black in FIG. 4a, but which may be a red background), with the runway 404 and the ALS 406 respectively appearing in two other different colours (green for the runway and yellow for the ALS for example).

However, with the objective of the invention being to assist with landing under degraded visibility conditions, advantageously, in a following step (306-2), the method allows, from the image of the first-level ground truth, various ground-truth images corresponding to various visibility conditions to be generated.

Since the sensors do not all have the same sensitivity to visibility conditions, the generation of the ground-truth images depends on the type of sensor that is simulated. Considering again the example of an IR sensor, the various visibility conditions result in a visibility distance decreased to a greater or lesser extent, which may be expressed in the image of the first-level ground truth by masking the top of the image to a variable height. FIGS. 4b to 4e illustrate four ground-truth images generated from the first-level ground truth of FIG. 4a, and showing four contexts in which visibility conditions are degraded. A mask having a fourth type of uniform information (grey in the figures but which could be a blue colour for example) covering the portion corresponding to the regions of zero visibility is superposed on the first-level ground-truth image in order to generate a masked ground-truth image (410-b to 410-e).

Thus, the step 306 of generating ground-truth images allows, on the basis of a simplified first-level ground-truth image, a multitude of masked ground-truth images to be generated, from an image corresponding to an excellent visibility in which the mask is applied from the top of the image to the horizon line (FIG. 4b for example), to an image corresponding to a visibility of almost zero in which the mask covers the entirety of the runway and the ALS (not illustrated).

In embodiments, the masked ground-truth images are generated so as to be separated by a pitch that is defined either in numbers of pixels, or in visibility distance converted into pixels.

Figure 5:
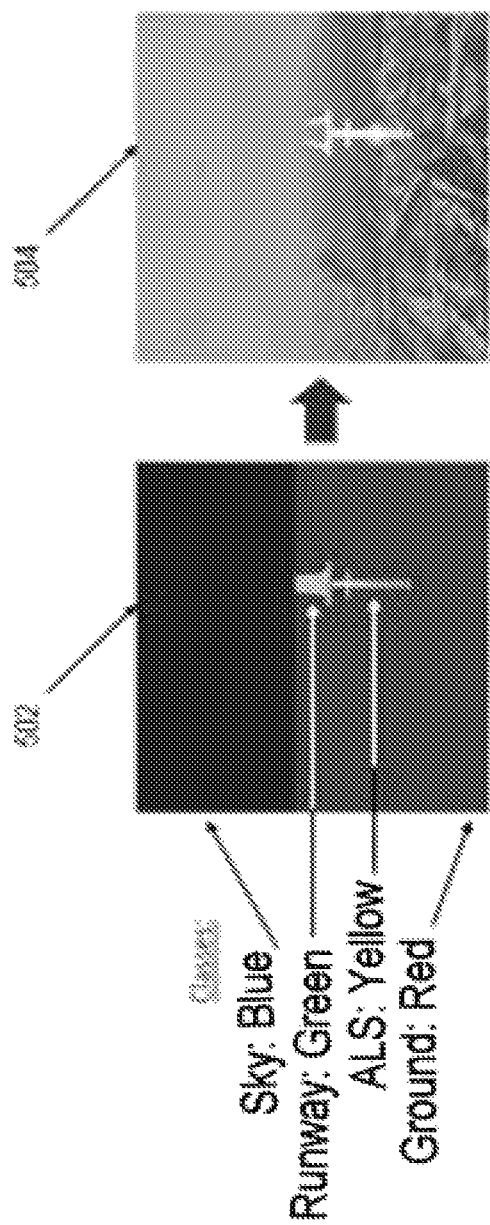
FIG. 5 a translation of an image semantically segmented into an IR image according to one embodiment of the invention.

In a following step 308, the method allows, on the basis of the masked ground-truth images that were generated, images to be translated, in order to obtain, for each masked ground-truth image output from the preceding step, various simulated sensor images. FIG. 5 illustrates a translation of a semantically segmented image 502 (image segmented into four classes: 'sky', 'runway', 'ALS', 'ground') into an IR image 504.

In one embodiment, the simulated sensor images may be stored in a synthetic training database.

As has been explained, it is very difficult, in the aeronautical field, to construct a training database that is realistic and varied, on the one hand because of physical limitations (various runways, weather types, approach times), financial limitations (high cost of this type of flight) or even technical limitations. Thus, to mitigate these drawbacks, the invention uses the generative properties of deep-learning neural networks based on deep generative models to generate new synthetic data that will correspond to a multitude of situations.

Before detailing the use of these deep generative models in the context of the invention, a general description thereof is given.

Description of GANs:

In recent years, progress in deep learning has allowed deep generative models, the objective of which is to generate new data that are completely synthetic but that are similar to the data used for training, to emerge. The two main classes of these algorithms are GANs (generative adversarial networks) or DCGANs (deep convolutional GANs), which were introduced by Goodfellow et al., and VAEs (variational auto-encoders). These generative models allow any type of data to be generated; there are examples in the literature where GANs have thus been employed to generate images, music and text, and they may also be used to improve the quality of certain data (simulated images for example).

A GAN is composed of two neural networks that are in competition with each other. The first network is the generator, the objective of which is to generate an imitation of the data starting with a noise vector. The second neural network is the discriminator, the objective of which is to determine whether the data that are presented thereto are real or if they are fakes generated by the generator. During training, the generator will generate imitations that increasingly resemble real data and the discriminator will find it increasingly difficult to differentiate real data from fakes. When, for each datum that is presented thereto, the discriminator is no longer able to determine whether the data are real or fakes (threshold of 50%), the training of the GAN is considered completed. Subsequently, the generator may be used to produce new data that will be very similar to the original set. To generate data that are not realistic and that could represent one of the situations presented above, a partially trained GAN is an interesting candidate that is able to deliver input data that are similar to actual data (for example images, the arrangement of the pixels of which is consistent with conventional data) but that correspond to physically impossible situations.

Many different architectures may be used for the neural networks of the generator and of the discriminator, but generally these neural networks are a sequence of a plurality of convolutional layers, of activation functions (ReLU, Leaky ReLU, sigmoid functions, etc.) and of other operations (dropout, softmax, maxpooling, etc.).

The following is one possible GAN or DCGAN architecture:

For the generator, a neural network with a plurality of, for example four, fractional strided convolutional layers, accompanied by batch normalization and activation functions such as: hyperbolic tangent (tanh), Leaky ReLU or ReLU.

For the discriminator, a neural network with a plurality of, for example four, strided convolutional layers, accompanied by batch normalization and activation functions (Leaky ReLU for example) may also be used.

Regarding the batch normalization, those skilled in the art know that it is generally necessary to insert batch normalizations after fully connected layers (FCCs) or convolutional layers and before the nonlinearity.

Initially, the generator produces images of mediocre quality and the loss value is high. Back-propagation allows the weights of the neurons of the generator to be updated in order to produce more realistic images during the training. It is important to note that the generator and the discriminator are not necessarily trained at the same time and that, generally, the training of the generator and of the discriminator is alternated (the weights of the generator then of the discriminator are set when one or other is trained, respectively).

Description of cGANs:

Although GANs are promising, during their use they exhibit a major disadvantage: the data that are produced by a GAN are unlabelled. Thus, these data may be used either as test data or else they must be subsequently labelled.

Figures 6, 7:
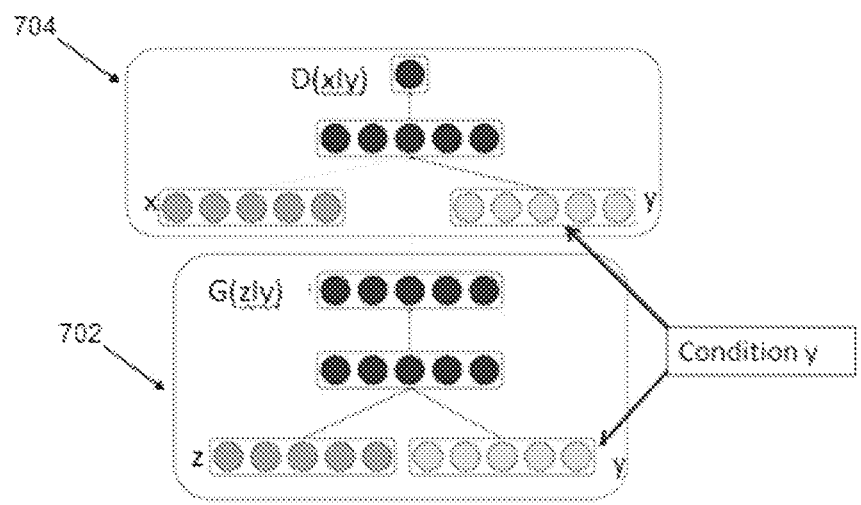
FIG. 6 an exemplary output of a cGAN for the MNIST dataset.
FIG. 7 an example of a cGAN architecture.

There are many variants of GANs, and conditional generative adversarial neural networks cGANs form part thereof. They were introduced shortly after GANs. They have a conventional GAN architecture but add an additional label to the input of the generator and of the discriminator. This label, which generally corresponds to a class, acts as a parameter for the cGAN; the output of the generator is dependent thereon and it indicates to the discriminator the database to which it must compare the image of the generator. For example, in the case of a dataset from the MNIST (Modified National Institute of Standards and Technology) database of numbers, the label that is applied to the input of the generator and of the discriminator is a vector that corresponds to the number that it is desired to generate. FIG. 6 illustrates an example of outputs from a cGAN for the MNIST dataset, each of the rows of the matrix 602 on the left-hand side showing the vector "y" that was passed by way of conditional setting, and each row of the image 604 on the right-hand side showing the outputs of the cGAN that respectively correspond to this setting. Thus, for example, to generate the number '4' visible in the fifth row of the image on the right-hand side, the vector [0,0,0,0,1,0,0,0,0,0] was passed as input to the generator of the cGAN. This property provides a mechanism for controlling the outputs of the generator.

One possible exemplary cGAN architecture, as shown in FIG. 7, can be the following:

A cGAN is composed of a generator 702 and of a discriminator 704. This model may for example be trained using stochastic gradient descent, the general objective being to find the generator that minimizes the precision of the real/fake predictions and to find the discriminator that maximizes the same predictions. A vector "z" designates the latent space, which in the case of GANs and cGANs is generally a random noise vector that follows a Gaussian distribution.

This objective is expressed by a function illustrated by the following equation, where the vector "y" (sometimes designated "c") represents the conditional setting applied to the cGAN, "z" corresponds to the noise vector and "x" corresponds to the datum to which the output G(z/y) of the generator is compared:

$$\min_G \max_D V(D, G) = E_{x \sim P_{data}(x)}[\log D(x \mid y)] + E_{z \sim P_z(z)}[\log(1 - D(G(z \mid y)))]$$

As specified above, the vector "y" is combined with the noise vector "z" in a joint hidden representation.

The neural network of the generator uses an architecture based on the U-Net architecture, which is very similar to the architecture of an auto-encoder. An auto-encoder is an unsupervised artificial neural network, the objective of which is to learn how to correctly compress and encode data, then to reconstruct these data with the highest possible fidelity. An auto-encoder decreases the dimensions of the data by learning to ignore noise present therein. A U-Net network (and an auto-encoder) possesses two networks: the encoder and the decoder. A U-Net network is an auto-encoder to which skipped connections have been added, these connections allowing information to pass between the layers of the encoder to the decoder directly.

A generator therefore uses a U-Net network itself composed of two networks: the encoder and the decoder. In one exemplary implementation, the encoder of the U-Net may for example consist of a set of convolutional layers followed by an activation function (Leaky ReLU for example). Each layer may also be followed by a batch normalization. The decoder of the generator also consists of a set of convolutional layers (preferably of a similar number to that of the encoder, for example seven) to which a plurality of operations (for example upsampling layers, convolutional layers, batch normalizations, and activation functions) may be applied.

The discriminator for its part employs a neural-network architecture that contains a plurality of convolutional layers (for example five) that may be followed by a plurality of operations such as batch normalizations and activation functions. The discriminator may sometimes employ the technique referred to as "PatchGAN", where PatchGAN is a deep convolutional neural network, the objective of which is to determine whether the image that is presented thereto is a real image or not. To do this, instead of classifying the entirety of the image, PatchGAN classifies blocks/patches (of N*N size with N*N<size of the image, for example blocks of 70 pixels×70 pixels) of the image and determines whether these blocks are real or fakes.

In another implementation, the generator and the discriminator may for example be multilayer perceptrons, with ReLU activation functions for the hidden layers and a sigmoid function for the output layer.

It is possible to improve the rendering of the images generated by such methods by implementing the SPADE technique (SPADE standing for spatially adaptive normalization) described in the article by Park, T. et al., "Semantic Image Synthesis with Spatially-adaptive Normalization". In CVPR, 2019.

Batch-normalization techniques are known in the art of machine vision and allow the quality of neural networks to be substantially improved while decreasing the time taken to train the latter. These normalization techniques train the affine layer after the normalizing stage, this making it possible to provide feedback as to the loss of semantic information that occurred during this stage. SPADE trains the affine layer from the semantic segmentation map directly, so that input semantic information may be preserved and affect all the layers. This technique allows the quality of the generated images to be greatly improved.

Thus, as indicated, the invention uses the generative properties of the GANs and cGANs presented above to generate new synthetic data. This variety in the dataset allows the system to be made more robust or bias to be avoided during the training of automatic runway-detection algorithms.

In one embodiment, a GAN may be used to generate synthetic test data. As recalled above, the data generated by a GAN are not labelled; nevertheless, once the training of the GAN has been completed, the generator may synthesize new data that are similar to those delivered as input.

Figure 8:
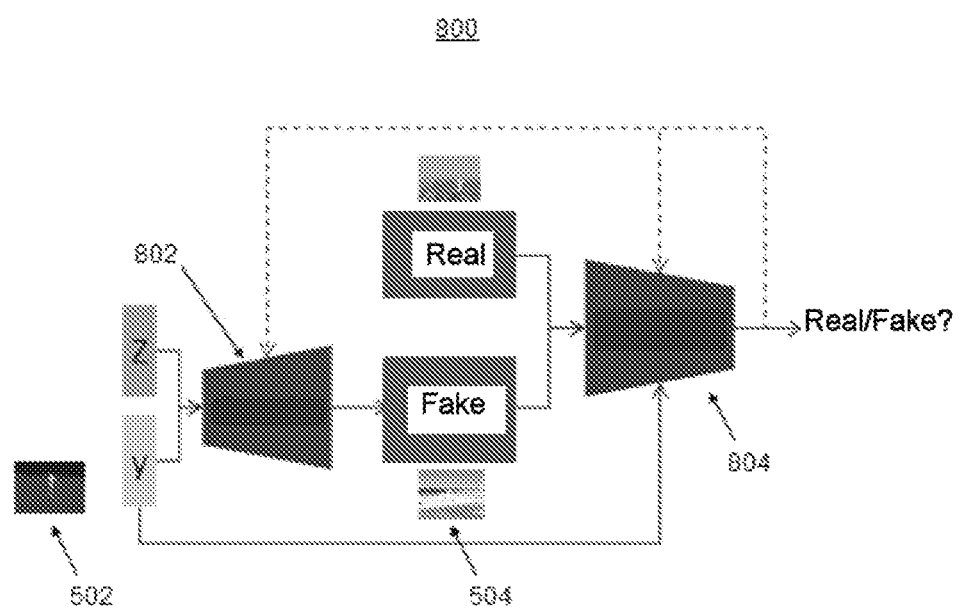
FIG. 8 a general architecture of a cGAN allowing synthetic training data to be generated according to one embodiment of the invention.

In another embodiment, a cGAN may be used to generate synthetic training data. FIG. 8 schematically illustrates a general architecture of a cGAN 800 composed of a generator 802 and of a discriminator 804 and allowing the image-translating step 308 according to one embodiment of the invention to be carried out. The inputs used to train the generator of the cGAN are a noise vector "z" and a conditional setting "y" that correspond to a semantically segmented image. Once the training (process illustrated by dashed lines) of the cGAN has been completed, the generator may translate a semantically segmented image 502 delivered as input into a new image 504 that may for example correspond to the same scene as the input image but seen with infrared vision.

Thus, by using the techniques described above, the method allows an image-to-image translation to be carried out using as input semantically segmented images in which each class/colour is associated with a label. Following its training, the cGAN is capable of carrying out a "translation" of a label to a texture. The ground truths, which are delivered by the ground-truth generator 206, are usable directly as input of the cGAN for an image-to-image translation.

In one embodiment, the ground truths generated after processing of the data of the flight model and of the flight parameters contain at least four classes or categories (ALS, runway, visible data, invisible data), each class being associated with one colour (yellow, green, red, blue), respectively. However, the number of classes may be higher than four to improve the level of detail in the generated image. Other potential classes may for example be: forests, roads, sky, clouds, boats, seas/oceans/lakes/rivers, towns or cities, buildings, airports, earth, snow, desert, etc. Conversely, those skilled in the art may consider using solely three classes (for example: visible, invisible, runway) in order to simplify the data-processing steps.

Advantageously, the database of synthetic data that is created according to the principles of the invention may be used as a training database for implementing a deep-learning runway-recognition algorithm based on artificial neural networks.

In one embodiment, the database of synthetic data is associated with a database of real training data in order to considerably increase the amount of training data.

Thus, the present invention describes various options with respect to the generation of new data:
 generation of new synthetic training data by implementing image-translation techniques using cGANs allowing realistic images to be generated from segmented images, the segmentation corresponding to the various labels of the segmented image. The generated image is a labelled image simulated by a cGAN corresponding to a realistic situation obtained on a simulator;
 generation using GANs of new unlabelled test data from unlabelled real data.

The present description illustrates a preferred but non-limiting implementation of the invention. Examples were chosen in order to allow a good comprehension of the principles of the invention and a concrete application, but they are in no way exhaustive and those skilled in the art will of course be able to make modifications and employ implementational variants while keeping to the same principles.

The invention claimed is:

1. A computer-implemented method for generating synthetic training data for an artificial-intelligence machine, the method comprising at least steps of:
 defining parameters for at least one approach scenario of an aircraft approaching a runway;
 using the parameters of said at least one scenario in a flight simulator to generate simulated flight data, said flight simulator being configured to simulate said aircraft in the phase of approach toward said runway and to simulate an associated automatic pilot;
 using the simulated flight data to generate a plurality of ground-truth images, said ground-truth images corresponding to various visibility conditions; and
 generating, from each ground-truth image, a plurality of simulated sensor images, said simulated sensor images being able to be used as training data to train an artificial-intelligence machine for assisting with aircraft landing.

2. The method according to claim 1, wherein the step of generating simulated sensor images consists in implementing, on a conditional generative adversarial neural network, an image-to-image translation algorithm, said image-to-image translation algorithm allowing a ground-truth image to be translated into a simulated sensor image.

3. The method according to claim 1, wherein the step of generating simulated sensor images consists in generating simulated infrared images.

4. The method according to claim 1, wherein the step of generating a plurality of ground-truth images comprises the steps of:
 generating a first-level ground-truth image wherein only a restricted number of elements of interest feature in the image, each element of interest respectively being represented by one type of uniform information, said elements of interest comprising at least the runway represented by a first type of uniform information and the approach light system represented by a second type of uniform information; and
 generating, from the first-level ground-truth image, various masked ground-truth images corresponding to different visibility conditions.

5. The method according to claim 1, wherein each masked ground-truth image contains at least four classes or colours, each class respectively being associated with one label.

6. The method according to claim 5, wherein at least four classes are the runway, the approach light system, visible data and invisible data.

7. The method according to claim 5, wherein the step of generating simulated sensor images consists in translating a label in a ground-truth image into a texture for a simulated sensor image.

8. The method according to claim 1, wherein the step of defining at least one approach scenario consists in defining parameters relative to at least one given runway, and to meteorological conditions and environmental conditions.

9. The method according to claim 1, wherein the step of generating simulated flight data consists in simulating various approach paths of the simulated aircraft and of the automatic pilot with the scenario parameters, and in generating simulated flight data for the various paths comprising the position (latitude, longitude, altitude) and the attitude (yaw, pitch, roll) of the simulated aircraft.

10. The method according to claim 1, in addition comprising a step consisting in storing the plurality of simulated sensor images in a database of synthetic training data.

11. A device for generating synthetic training data for an artificial-intelligence machine, the device comprising means for implementing the steps of the method according to claim 1.

12. A computer program containing code instructions for executing the steps of the method for generating synthetic training data for an artificial-intelligence machine, according to claim 1, when said program is executed by a processor.

* * * * *